(12) United States Patent
Shih et al.

(10) Patent No.: US 8,856,435 B1
(45) Date of Patent: Oct. 7, 2014

(54) EXTERNAL, SELF-INITIALIZING CONTENT ADDRESSABLE MEMORY FREE INDEX STORAGE DEVICE

(75) Inventors: Milton H. Shih, Medford, MA (US); Robert J. Weisenbach, Needham, MA (US)

(73) Assignee: Oracle America, Inc., Redwood City, CA (US)

( * ) Notice: Subject to any disclaimer, the term of this patent is extended or adjusted under 35 U.S.C. 154(b) by 916 days.

(21) Appl. No.: 11/923,906

(22) Filed: Oct. 25, 2007

(51) Int. Cl.
*G06F 12/00* (2006.01)
(52) U.S. Cl.
USPC .......... 711/108; 711/100; 711/101; 711/205; 711/156; 711/E12.006

(58) Field of Classification Search
USPC .......... 711/100, 101, 108, 156, 205, E12.006
See application file for complete search history.

(56) References Cited

U.S. PATENT DOCUMENTS

| 6,772,279 B1* | 8/2004 | Sun et al. ...................... 711/108 |
| 2002/0029327 A1* | 3/2002 | Roth ............................. 711/217 |

* cited by examiner

*Primary Examiner* — Midys Rojas
(74) *Attorney, Agent, or Firm* — Brooks Kushman P.C.

(57) ABSTRACT

A method, apparatus and computer program product for an external, self-initializing FIFO containing indexes of free CAM memory locations is presented. When data is sent to the CAM for a lookup, this external FIFO provides the CAM with the index of a free memory location within the CAM so that if the data word is not found in the CAM (i.e. a CAM miss), the data can be written to the designated available free entry in the CAM. Thus, if the same data word is searched in the CAM in the following cycle it will result in a hit.

23 Claims, 4 Drawing Sheets

EXTERNAL, SELF-INITIALIZING CONTENT ADDRESSABLE MEMORY FREE INDEX STORAGE DEVICE

BACKGROUND

CAMs (Content Addressable Memories) are computer memory structures designed to facilitate fast searches of their memory contents. The user supplies the CAM with data to look up, and the CAM will search its entire memory contents for the data. If the data exists in the CAM, then the index of the CAM memory location where the word is stored is returned to the user along with a "hit" result. If the data does not exist in the CAM, then a "miss" result is returned and it is written to an available, free entry in the CAM.

Conventional mechanisms such as those explained above suffer from a variety of deficiencies. One such deficiency occurs in applications where a CAM hit/miss determination must be made in one clock cycle. In this scenario, locating a free CAM entry to write upon a miss can complicate the design of the CAM. Because the logic in the CAM is such that all memory entries must be examined, the additional logic needed to locate free entries can make it difficult for the CAM design to operate at high clock frequencies. One type of memory storage device is known as a First-In-First-Out (FIFO) device

SUMMARY

Embodiments of the invention significantly overcome such deficiencies and provide mechanisms and techniques by utilizing an external, self-initializing FIFO containing indexes of free CAM memory locations. In a FIFO device, the first items entered are the first ones to be removed. In other words, the items are removed in the same order they are entered or made.

When data is sent to the CAM for a data or a word lookup, this external FIFO provides the CAM with the index of a free memory location within the CAM so that if the data word is not found in the CAM (i.e. a CAM miss), the data can be written to the designated available free entry in the CAM. Thus, if the same data word is searched in the CAM in the following cycle it will result in a hit.

In a particular embodiment of a method for providing an external, self-initializing CAM free index storage device, the method includes providing a storage device for storing an index of free entries for a CAM. The method further includes populating the storage device with an index of free entries for the CAM and determining whether a lookup operation for the CAM resulted in a miss. When the lookup operation results in a miss then utilizing a first free entry in the storage device to write the data subject of the lookup operation into the CAM and removing the first entry from the storage device. When the lookup operation results in a hit) then returning the location of the data Other embodiments include a computer readable medium having computer readable code thereon for providing an external, self-initializing CAM free index storage device, the computer readable medium includes instructions for providing a storage device for storing an index of free entries for a CAM. The computer readable medium further includes instructions for populating the storage device with an index of free entries for the CAM and instructions for determining whether a lookup operation for the CAM resulted in a miss. When the lookup operation did result in a miss then utilizing a first entry in the storage device to write the data subject of the lookup operation into the CAM and removing the first entry from the storage device. When the lookup operation did not result in a miss (i.e. resulted I a hit) then refraining from using the index of free entries for the CAM.

Still other embodiments include a computerized device, configured to process all the method operations disclosed herein as embodiments of the invention. In such embodiments, the computerized device includes a memory system, a processor, communications interface in an interconnection mechanism connecting these components. The memory system is encoded with a process that provides an external, self-initializing CAM free index storage device as explained herein that when performed (e.g. when executing) on the processor, operates as explained herein within the computerized device to perform all of the method embodiments and operations explained herein as embodiments of the invention. Thus any computerized device that performs or is programmed to perform up processing explained herein is an embodiment of the invention.

Other arrangements of embodiments of the invention that are disclosed herein include software programs to perform the method embodiment steps and operations summarized above and disclosed in detail below. More particularly, a computer program product having a computer-readable medium including computer program logic encoded with software for performing operations associated with providing an external self initializing CAM as explained herein. The computer program logic, when executed on at least one processor within a computing system, causes the processor to perform the operations (e.g., the methods) indicated herein as embodiments of the invention. Such arrangements of the invention are typically provided as software, code and/or other data structures arranged or encoded on a computer readable medium such as an optical medium (e.g., CD-ROM), floppy or hard disk or other a medium such as firmware or microcode in one or more ROM or RAM or PROM chips or as an Application Specific Integrated Circuit (ASIC) or as downloadable software images in one or more modules, shared libraries, etc. The software or firmware or other such configurations can be installed onto a computerized device to cause one or more processors in the computerized device to perform the techniques explained herein as embodiments of the invention. Software processes that operate in a collection of computerized devices, such as in a group of data communications devices or other entities can also provide the system of the invention. The system of the invention can be distributed between many software processes on several data communications devices, or all processes could run on a small set of dedicated computers, or on one computer alone.

It is to be understood that the embodiments of the invention can be embodied strictly as a software program, as software and hardware, or as hardware and/or circuitry alone, such as within a data communications device. The features of the invention, as explained herein, may be employed in data communications devices and/or software systems for such devices such as those manufactured by Sun Microsystems, Inc. of Santa Clara, Calif.

BRIEF DESCRIPTION OF THE DRAWINGS

The foregoing will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

A method, apparatus and computer program product for an external, self-initializing FIFO containing indexes of free CAM memory locations is presented. When a data word is sent to the CAM for a lookup, this external FIFO provides the CAM with the index of a free memory location within the CAM so that if the data word is not found in the CAM (i.e. a CAM miss), the data can be written to the designated available free entry in the CAM. Thus, if the same data word is searched in the CAM in the following cycle it will result in a hit.

Figure 1:
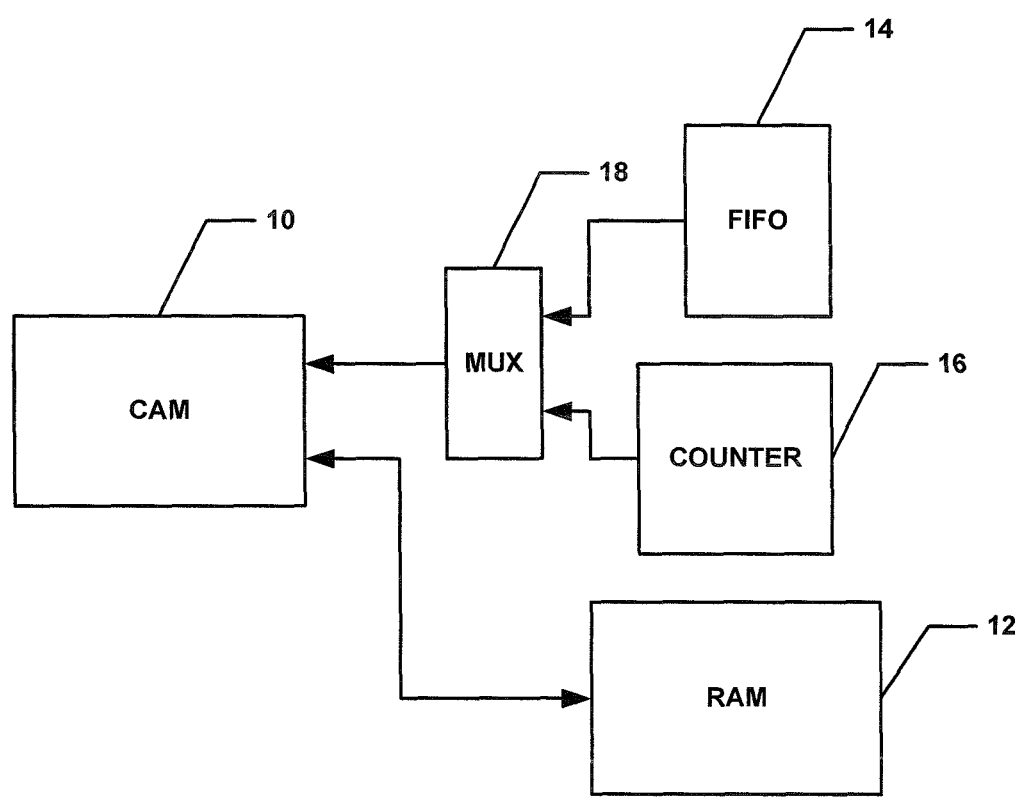
FIG. 1 depicts a high-level block diagram showing a CAM and a FIFO in accordance with embodiments of the invention.

Referring now to FIG. 1, an environment is shown wherein free indexes for a CAM are stored and utilized. CAM 10 is in communication with Random Access Memory (RAM) 12. Also shown is a MUX 18 that provides an output to the CAM. The MUX 18 has a first set of inputs connected to the output of a storage device (FIFO) 14. MUX 18 has a second set of inputs connected to the output of Counter 16.

CAM 10 supports several operations, including address lookup, address write and address clear. At a high level asserting a read signal along with a read address provided to the CAM performs an address lookup operation. In the next cycle the CAM 10 returns a hit or a miss. A hit occurs when the data subject to the lookup operation is found in the CAM. A miss occurs when the data subject to the lookup operation is not found in the CAM.

If a miss occurs in the CAM 10 during a lookup, then the read address is written into the CAM 10 at the index specified by the first free entry of the storage device. If the read address hits in the CAM 10, then CAM 10 asserts a hit signal and a hit index contains the index of the CAM 10 entry that was matched.

In the same cycle that a CAM data lookup occurs, the FIFO 14 provides the CAM 10 (by way of MUX 18) with the index of available free entries in the CAM 10. The CAM 10 will write the data to this entry and return a "miss" result if the data word does not already exist in the CAM 10. If the data does exist in the CAM 10, then the CAM 10 will not use the free index and will return a "hit" result. If a CAM 10 entry is hit at the same time it is being cleared, the hit result will be returned.

The FIFO 14 used to store free CAM 10 memory indexes may provide a new index at head of the FIFO 14 every clock cycle until the FIFO 14 is empty. As indexes are available in FIFO 14, additional indexes are entered at the tail end of the FIFO 14. Free indexes can be entered at the tail of FIFO 14 in the same cycle that CAM 10 indexes at the head are being utilized.

The FIFO 14 provides for precalculation of next free CAM index. If the current word lookup results in a CAM 10 miss, then the FIFO 14 increment a head pointer associated with FIFO 14 during the same cycle as the CAM 10 hit/miss result so that the head pointer points to the next free CAM 10 entry. Accordingly, in the same cycle the hit/miss results are returned, another CAM 10 lookup may take place. If the current data lookup results in a hit in the CAM 10, then there is no need to update the head of the FIFO 14. The CAM 10 hit/miss result is a live signal output from the CAM 10 and is on a timing critical path so to avoid placing too much logic after the CAM lookup. The FIFO 14 will precalculate the "hit" and "miss" free indexes ahead of time and use the CAM hit/miss result to select between the precalculated indexes.

For the first N writes into the CAM 10 (where N is the number of entries in the CAM) the FIFO 14 utilizes a counter 16 from 0 to N−1 and uses the counter value as the next free index. The MUX 18 will use the results from the counter 16 until the N−1 limit is reached, at which time the MUX 18 will then utilize the FIFO 14 to determine the next free index in the CAM 10. After N writes to the CAM 10, the head of the FIFO 14 may provide the next free index.

CAMs traditionally calculate free entries internally using a priority-encoded bit vector of available entries. Priority-encoders do not scale well to large numbers since they are implemented as serial logic (as opposed to a binary tree). By using a FIFO, a next free CAM entry is determined much faster and thus, scales well to large sizes as compared to a priority encoder. By having an external FIFO, the logic of the CAM is simplified so a CAM designer can concentrate on making the data word compare logic as small and efficient as possible.

In contrast with a traditional FIFO, the FIFO 14 self-initializes by using counter 16 and speculatively precalculates the next free CAM index.

Figure 2:
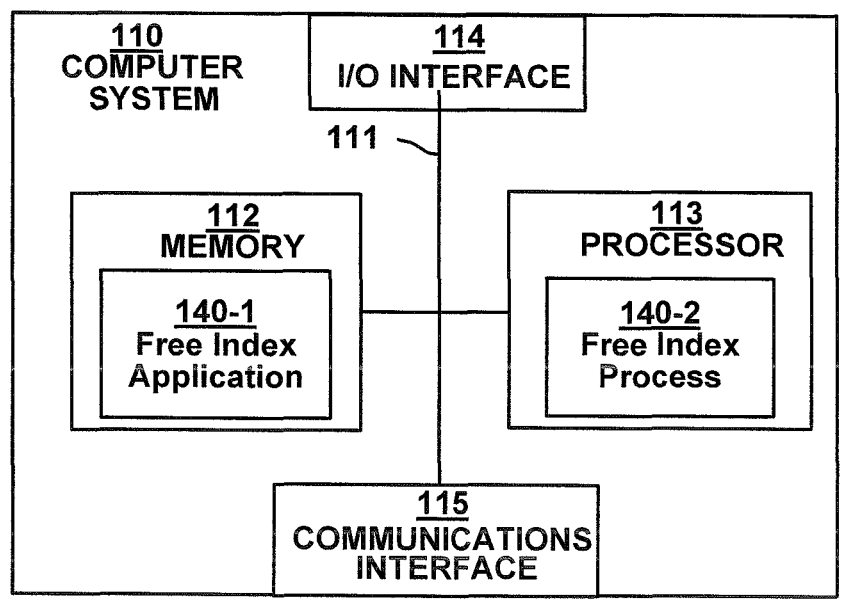
FIG. 2 illustrates an example computer system architecture for a computer system that provides an external, self-initializing CAM free index storage device in accordance with embodiments of the invention.

FIG. 2 is a block diagram illustrating an example computer system 100 for implementing free index function 140 and/or other related processes to carry out the different functionality as described herein.

As shown, computer system 100 of the present example includes an interconnect 111 that couples a memory system 112 and a processor 113 an input/output interface 114, and a communications interface 115.

As shown, memory system 112 is encoded with free index application 140-1. Free index application 140-1 can be embodied as software code such as data and/or logic instructions (e.g., code stored in the memory or on another computer readable medium such as a disk) that support functionality according to different embodiments described herein.

During operation, processor 113 of computer system 100 accesses memory system 112 via the interconnect 111 in order to launch, run, execute, interpret or otherwise perform the logic instructions of the free index application 140-1. Execution of free index application 140-1 produces processing functionality in free index process 140-2. In other words, the free index process 140-2 represents one or more portions of the free index application 140-1 (or the entire application) performing within or upon the processor 113 in the computer system 100.

It should be noted that, in addition to the free index process 140-2, embodiments herein include the free index application 140-1 itself (i.e., the un-executed or non-performing logic instructions and/or data). The free index application 140-1 can be stored on a computer readable medium such as a floppy disk, hard disk, or optical medium. The free index application 140-1 can also be stored in a memory type system such as in firmware, read only memory (ROM), or, as in this example, as executable code within the memory system 112 (e.g., within Random Access Memory or RAM).

In addition to these embodiments, it should also be noted that other embodiments herein include the execution of free index application 140-1 in processor 113 as the free index process 140-2. Those skilled in the art will understand that the computer system 100 can include other processes and/or software and hardware components, such as an operating system that controls allocation and use of hardware resources associated with the computer system 100.

Figure 3:
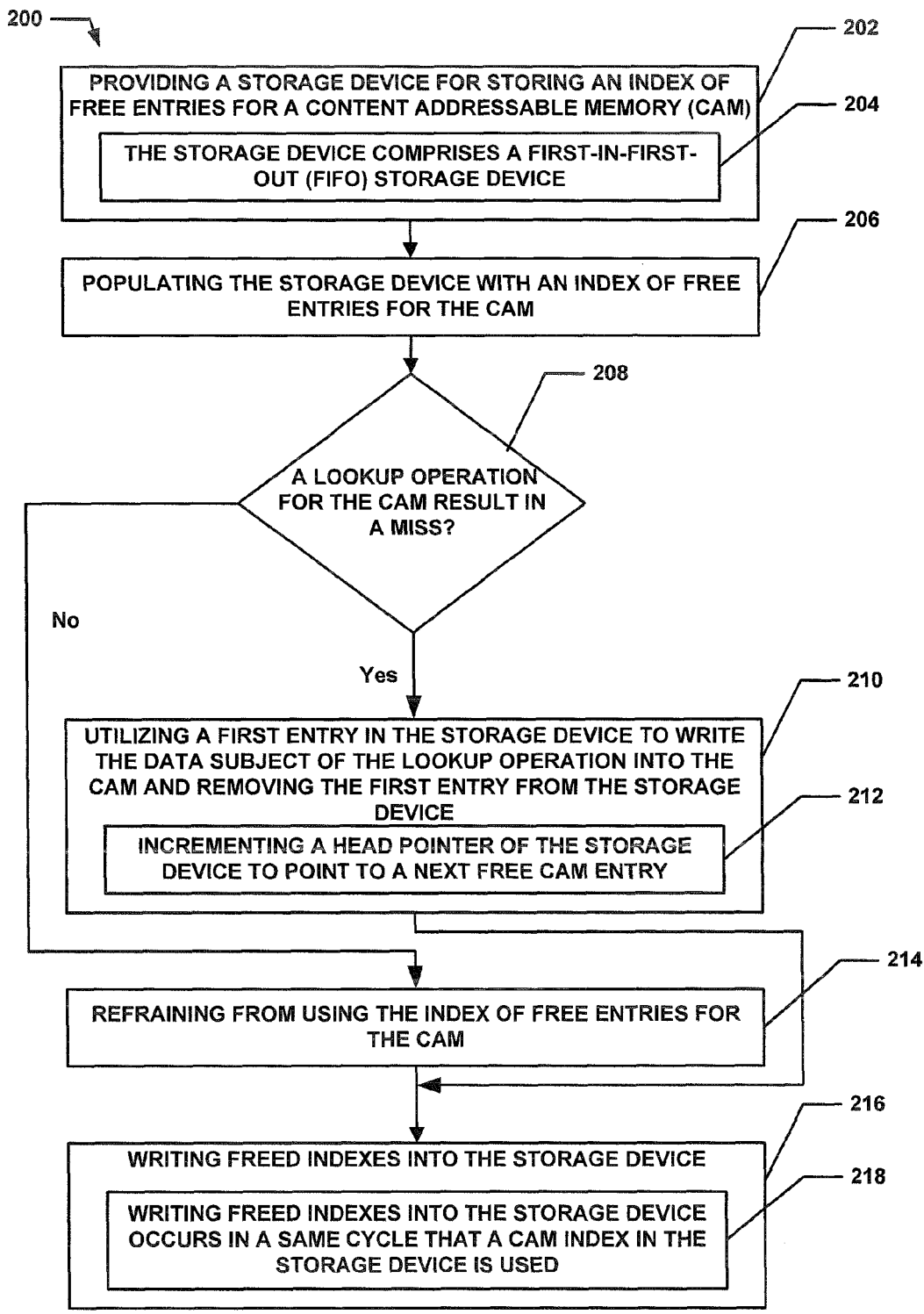
FIG. 3 depicts a flow diagram of a particular embodiment of a method of providing an external, self-initializing CAM free index storage device in accordance with embodiments of the invention.
Figure 4:
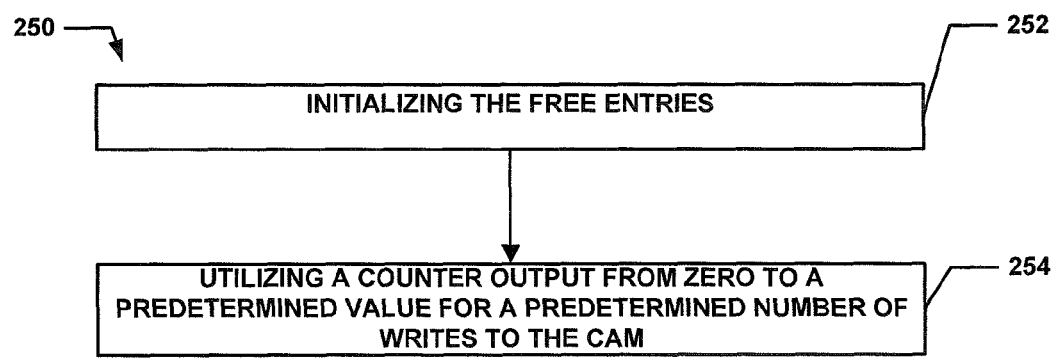
FIG. 4 illustrates a flow diagram of a particular embodiment of a method for initializing free entries for a CAM in accordance with embodiments of the invention.

Flow charts of the presently disclosed methods are depicted in FIGS. 3 and 4. The rectangular devices are herein denoted "processing blocks" and represent computer software instructions or groups of instructions. The diamond shaped elements, are herein denoted "decision blocks," represent computer software instructions, or groups of instructions which affect the execution of the computer software instructions represented by the processing blocks.

Alternatively, the processing blocks and decision blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required in accordance with the present invention. It should be noted that many routine program devices, such as initialization of loops and variables and the use of temporary variables are not shown. It will be appreciated by those of ordinary skill in the art that unless otherwise indicated herein, the particular sequence of steps described is illustrative only and can be varied without departing from the spirit of the invention. Thus, unless otherwise stated the steps described below are unordered meaning that, when possible, the steps can be performed in any convenient or desirable order.

Referring now to FIG. 3, a particular embodiment of a method 200 for storing an index of free entries for a Content Addressable Memory (CAM) is shown. Method 200 begins with processing block 202, which discloses providing a storage device for storing an index of free entries for a Content Addressable Memory (CAM). The CAM supports several operations, including address lookup, address write and address clear. As shown in processing block 204, in this embodiment the storage device comprises a first-in-first-out (FIFO) storage device.

Processing block 206 states populating the storage device with an index of free entries for the CAM. Decision block 208 determines whether a lookup operation for the CAM resulted in a miss. In the same cycle that a CAM data word lookup occurs, the FIFO provides the CAM with the index of an available free entry in the CAM. The CAM will write the data word to this entry and return a "miss" result if the data word does not already exist in the CAM. If the data word does exist in the CAM, then the CAM will not use the free index and will return a "hit" result.

When the lookup operation of stage 208 results in a miss method 200 proceeds to stage 210. During stage 210, method 200 utilizes a first entry in the storage device to write the data that is the subject of the lookup operation into the CAM and removes the first entry from the storage device. At stage 212 method 200 increments a head pointer of the storage device to point to a next free CAM entry. The storage device provides for precalculation of next free CAM index. If the current data lookup results in a CAM miss, then the storage device may increment the head pointer in the same cycle as the CAM hit/miss result causing the head pointer to point to the next free CAM entry. This covers the scenario wherein in the same cycle the hit/miss results are seen, another CAM lookup could be taking place and requires a free CAM index. If the current data word lookup results in a hit in the CAM, then there is no need to update the head of the storage device. The storage device will precalculate the "hit and "miss" free indexes ahead of time and then use the CAM hit/miss result to select between the precalculated indexes.

When the lookup operation of stage 208 results in a hit then method 200 proceeds to stage 214. At stage 214 method 200 refrains from using the index of free entries for the CAM.

Processing continues at stage 216 by writing freed indexes into the storage device. As shown in stage 218, writing freed indexes into the storage device may occur in a same cycle that a CAM index in the storage device is used. The storage device used to store free CAM memory indexes may provide a new index at the head of the storage device every clock cycle until the storage device is emptied. As indexes are available, an available index is entered at the tail end of the storage device. Available indexes can be written to the tail in the same cycle that CAM indexes at the head are used up.

Referring now to FIG. 4, a particular embodiment of a method 250 for initializing the free entries is shown. Processing begins with stage 252, which discloses initializing the free entries. Stage 254 recites utilizing a counter output from zero to a predetermined value for a predetermined number of writes to the CAM. The predetermined number of writes comprises the number of entries in the CAM. For the first N writes into the CAM (where N is the number of entries in the CAM) the storage device utilizes a counter from 0 to N−1 and uses the counter value as the next free index. The MUX 18 will use the results from the counter until the N−1 limit is reached, at which time the MUX 18 will then utilize the FIFO After N writes to the CAM, then the head of the storage device will provide the next index.

In a particular example, the CAM will contain 96 entries. Thus, a 7-bit counter is used to generate the free CAM indexes for the first 96 writes to the CAM. The counter will increment from 0 to 95 each time a new CAM entry is written. The first 96 entries written into the CAM will write to indexes 0-95 respectively. Once 96 entries have been written into the CAM, each subsequent write in to the CAM will get the next free CAM index from the FIFO of free CAM indexes. CAM indexes that are freed up before 96 entries have been written into the CAM will be put into the FIFO once they have been released, but will not be used until after the $96^{th}$ CAM entry has been written. In this example, each CAM entry contains the address of an outstanding cacheable transaction.

In summary, an external, self-initializing storage device containing indexes of free CAM memory locations is utilized to provide improved operation of a CAM. When data is sent to the CAM for lookup, this external storage device provides the CAM with the index of free memory locations within the CAM so that if the data is not found in the CAM (i.e. a CAM miss), the data can be written to a designated available free entry in the CAM. Thus, if the same data word is searched in the CAM in the following cycle it will result in a hit.

Throughout the entirety of the present disclosure, use of the articles "a" or "an" to modify a noun may be understood to be used for convenience and to include one, or more than one of the modified noun, unless otherwise specifically stated.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein.

Having described preferred embodiments of the invention it will now become apparent to those of ordinary skill in the art that other embodiments incorporating these concepts may be used. Additionally, the software included as part of the invention may be embodied in a computer program product that includes a computer useable medium. For example, such a computer usable medium can include a readable memory device, such as a hard drive device, a CD-ROM, a DVD-ROM, or a computer diskette, having computer readable program code segments stored thereon. The computer readable medium can also include a communications link, either optical, wired, or wireless, having program code segments carried thereon as digital or analog signals. Accordingly, it is submitted that that the invention should not be limited to the described embodiments but rather should be limited only by the spirit and scope of the appended claims.

What is claimed is:

1. A method comprising:
   using a storage device for storing indices of free entries for a Content Addressable Memory (CAM);
   populating said storage device with indices of free entries for said CAM;
   determining whether a lookup operation for said CAM resulted in a miss, wherein when said lookup operation results in a miss, utilizing a first entry in said storage device to write data subject of said lookup operation into said CAM and removing said first entry from said storage device, and when said lookup operation results in a hit then refraining from using said indices of free entries for said CAM;
   precalculating a next available one of said indices of free entries in a same cycle as said determining whether a lookup operation for said CAM resulted in a miss; and
   using a next available one of said indices of free entries in response to a next lookup operation for said CAM that results in a miss,
   wherein said free entries stored in said storage device are particular free memory locations within said CAM such that data is written into said CAM at said particular free memory locations.

2. The method of claim 1 wherein said utilizing a first entry in said storage device further comprises incrementing a head pointer of said storage device to point to an available one of said indices of free entries and wherein said precalculating uses an additional head pointer of said storage device to point to said next available one of said indices of free entries.

3. The method of claim 1 further comprising writing freed indices into said storage device.

4. The method of claim 3 wherein said writing freed indices into said storage device occurs in a same cycle that a CAM index in said storage device is used.

5. The method of claim 1 further comprising initializing said free entries.

6. The method of claim 5 wherein said initializing said free entries includes utilizing a counter output from zero to a predetermined value for a predetermined number of writes to said CAM.

7. The method of claim 6 wherein said predetermined number of writes comprises the number of entries in said CAM.

8. The method of claim 1 wherein said storage device comprises a first-in-first-out (FIFO) storage device.

9. An apparatus comprising:
   a content addressable memory (CAM);
   a storage device for storing indices of free entries for a Content Addressable Memory (CAM);
   memory;
   a processor;
   a communications interface;
   an interconnection mechanism coupling at least two of said storage device, CAM, memory, processor and communications interface; and
   wherein said memory is encoded with an application providing CAM free index storage, that when performed on said processor, provides a process for processing information, said process causing the apparatus to perform the operations of:
   using a storage device for storing indices of free entries for a Content Addressable Memory (CAM);
   populating said storage device with indices of free entries for said CAM;
   determining whether a lookup operation for said CAM resulted in a miss, wherein when said lookup operation results in a miss, utilizing a first entry in said storage device to write data subject of said lookup operation into said CAM and removing said first entry from said storage device, and when said lookup operation results in a hit then refraining from using said indices of free entries for said CAM,
   precalculating a next available one of said indices of free entries in a same cycle as said determining whether a lookup operation for said CAM resulted in a miss; and
   using a next available one of said indices of free entries in response to a next lookup operation for said CAM that results in a miss,
   wherein said free entries stored in said storage device are particular free memory locations within said CAM such that data is written into said CAM at said particular free memory locations.

10. The apparatus of claim 9 wherein a head pointer of said storage device is incremented to point to an available one of said indices of free entries when a first entry in said storage device is utilized and wherein said precalculating uses an additional head pointer of said storage device to point to said next available one of said indices of free entries.

11. The apparatus of claim 9 wherein freed indices are written into said storage device.

12. The apparatus of claim 11 wherein said freed indices are written into said storage device in a same cycle that a CAM index in said storage device is used.

13. The apparatus of claim 9 wherein said free entries are initialized.

14. The apparatus of claim 13 wherein said free entries are initialized utilizing a counter output from zero to a predetermined value for a predetermined number of writes to said CAM.

15. The apparatus of claim 14 wherein said predetermined number of writes comprises the number of entries in said CAM.

16. The apparatus of claim 9 wherein said storage device comprises a first-in-first-out (FIFO) storage device.

17. A non-transitory machine readable storage medium having computer readable code thereon for storing indices of free entries for a Content Addressable Memory (CAM), the medium comprising:
   instructions for using a storage device for storing indices of free entries for a Content Addressable Memory (CAM);
   instructions for populating said storage device with indices of free entries for said CAM;
   instructions for determining whether a lookup operation for said CAM resulted in a miss, wherein when said lookup operation results in a miss, utilizing a first entry in said storage device to write data subject of said lookup operation into said CAM and removing said first entry from said storage device, and when said lookup operation results in a hit then refraining from using said indices of free entries for said CAM, instructions for precalculating a next available one of said indices of free entries in a same cycle as said determining whether a lookup operation for said CAM resulted in a miss; and instructions for using said next available one of the indices of free entries in response to a next lookup operation for said CAM that results in a miss, wherein said free entries stored in said storage device are particular free memory locations within said CAM such that data is written into said CAM at said particular free memory locations.

18. The non-transitory machine readable storage medium of claim 17 wherein said instructions for utilizing a first entry in said storage device further comprise instructions for incrementing a head pointer of said storage device to point to an available one of said indices of free entries and wherein said instructions for precalculating further comprise instructions for using an additional head pointer of said storage device to point to said next available one of said indices of free entries.

19. The non-transitory machine readable storage medium of claim 17 further comprising instructions for writing freed indices into said storage device.

20. The non-transitory machine readable storage medium of claim 19 wherein said instructions for writing freed indices into said storage device occurs in a same cycle that a CAM index in said storage device is used.

21. The non-transitory machine readable storage medium of claim 17 further comprising instructions for initializing said free entries.

22. The non-transitory machine readable storage medium of claim 21 wherein said instructions for initializing said free entries comprises instructions for utilizing a counter output from zero to a predetermined value for a predetermined number of writes to said CAM.

23. The non-transitory machine readable storage medium of claim 22 wherein said predetermined number of writes comprises the number of entries in said CAM.

\* \* \* \* \*

UNITED STATES PATENT AND TRADEMARK OFFICE
CERTIFICATE OF CORRECTION

| | | |
|---|---|---|
| PATENT NO. | : 8,856,435 B1 | Page 1 of 1 |
| APPLICATION NO. | : 11/923906 | |
| DATED | : October 7, 2014 | |
| INVENTOR(S) | : Shih et al. | |

It is certified that error appears in the above-identified patent and that said Letters Patent is hereby corrected as shown below:

In The Specification

In column 6, line 62, delete "and or" and insert -- and/or --, therefor.

In column 7, line 10, delete "that that" and insert -- that --, therefor.

Signed and Sealed this
Twenty-eighth Day of April, 2015

Michelle K. Lee
*Director of the United States Patent and Trademark Office*